United States Patent
Degoirat et al.

(10) Patent No.: US 7,254,767 B2
(45) Date of Patent: Aug. 7, 2007

(54) DECODING AND ERROR CORRECTION METHOD

(75) Inventors: Hubert Degoirat, Aix-en-Provence (FR); Loic Parlier, Saint-Witz (FR)

(73) Assignee: STMicroelectronics SA, Montrouge (FR)

( * ) Notice: Subject to any disclaimer, the term of this patent is extended or adjusted under 35 U.S.C. 154(b) by 443 days.

(21) Appl. No.: 10/858,866

(22) Filed: Jun. 2, 2004

(65) Prior Publication Data

US 2005/0010851 A1    Jan. 13, 2005

Related U.S. Application Data

(63) Continuation of application No. PCT/FR02/04116, filed on Nov. 29, 2002.

(30) Foreign Application Priority Data

Dec. 7, 2001    (FR) .................................. 01 15877

(51) Int. Cl.
*H03M 13/00* (2006.01)
(52) U.S. Cl. ..................... 714/758; 713/193
(58) Field of Classification Search ................ 714/758; 713/193

See application file for complete search history.

(56) References Cited

U.S. PATENT DOCUMENTS

| | | | |
|---|---|---|---|
| 5,608,739 A | 3/1997 | Snodgrass et al. | |
| 5,991,308 A * | 11/1999 | Fuhrmann et al. | 370/395.53 |
| 6,650,630 B1 * | 11/2003 | Haartsen | 370/345 |
| 6,778,316 B2 * | 8/2004 | Halas et al. | 359/296 |
| 2003/0046238 A1 * | 3/2003 | Nonaka et al. | 705/51 |

FOREIGN PATENT DOCUMENTS

EP    0461787    12/1991

OTHER PUBLICATIONS

Patent Abstracts of Japan, vol. 2000, No. 14, Mar. 5, 2001 & JP 2000305861A, Hitachi Ltd., Nov. 2, 2000.

* cited by examiner

*Primary Examiner*—Guy J. Lamarre
(74) *Attorney, Agent, or Firm*—Lisa K. Jorgenson; Allen, Dyer, Doppelt, Milbrath & Gilchrist, P.A.

(57) ABSTRACT

A decoding and error correcting method is applicable to a secured code word that may have an error relative to an initial secured code word. The method includes an error correcting step, and a decoding step using a decoding function. The decoding step may be carried out before the error correcting step, and includes applying the decoding function to the secured code word to obtain a secured decoded word containing a coded error. The method reduces the decoding and error correcting time of the secured code word.

25 Claims, 3 Drawing Sheets

DECODING AND ERROR CORRECTION METHOD

RELATED APPLICATION

The present application is a continuation of International Application No. PCT/FR02/04116 filed on Nov. 29, 2002, the entire disclosure of which is incorporated herein by reference.

FIELD OF THE INVENTION

The present invention relates to a decoding and error correcting method applicable to a secured code word. The present invention also relates to a decoding and error correcting circuit for transforming a secured code word into a corrected decoded word.

BACKGROUND OF THE INVENTION

Data security/correction devices are widely used to write data in memories, particularly electrically erasable and programmable memories of the EEPROM or FLASH EEPROM type. Data is secured when saved in the memory by adding security bits, and the data is corrected as a result of the security bits when read.

Moreover, data is traditionally coded before being saved in a memory when a certain level of confidentiality is required, and the data is decoded when the memory is read. Coding is defined to mean coding a binary word by a scrambling function to obtain a coded word. Therefore, sometimes combining a coding function and a security function in a single device is required to obtain from initial data a secured coded data entry, i.e., a binary word having undergone a double coding and security process.

FIG. 1 represents in block form a prior art data security/correction device ECC1. The device ECC1 comprises a data security circuit WR1 and a data correction circuit RD1. The circuit WR1 has one input IN1 to receive a binary word X1, and one output OUT1 to deliver a secured word X2. The circuit RD1 has one input IN2 to receive the secured word X3 having an error E, and one output OUT2 to deliver a corrected word X4.

The circuit WR1 comprises a block B1 that applies a function G to the word X1, and delivers the secured word X2. The function G is a security bit generation function that can be represented in the form of a matrix of ($2^K$) lines and ($2^K$+J) columns. By representing the binary word X1 in the form of a vector of $2^K$ bits, the secured word X2 obtained complies with the following relation:

$$X2 = X1 * G = DATA(X2) // CODE(X2).$$

The symbol * represents a matrix product, // is a symbol for concatenation (i.e., linking together in series or in a chain), DATA(X2) is a first part of the word X2 comprising $2^K$ data bits, and CODE(X2) is a second part of the word X2 comprising J security bits.

The function G does not change the data bits of the initial word X1, such that the word DATA(X2) comprises data bits equal to those of the initial word X1. Therefore, the following can be written:

$$X2 = X1 // CODE(X2).$$

As an example, it will be assumed that only one bit is to be detected and corrected in a word of eight bits by the Hamming algorithm. According to this algorithm, the number J of security bits must be equal to K+1 to detect and correct only one error bit in a word of $2^K$ bits. Therefore, in this example, K=3 and J=K+1=4 and the words X1, X2 are written as described in part 1 of the supplemental information, which follows the detailed description. The function G is a matrix of $2^K$ lines and ($2^K$+K+1) columns, i.e., 8 lines and 12 columns, as described in part 2 of the supplemental information. The matrix G generates 4 security or parity bits p0, p1, p2, p3 as described in part 3 of the supplemental information.

It is now assumed that the secured word X2 is saved in a memory MEM, and that it is then read in that memory. Between the writing of the word and the moment it is read, the word is likely to be altered, which results in the word having an error. Such an error, statistically speaking, is quite frequent with electrically erasable and programmable memories of the EEPROM or FLASH EEPROM type. This is generally due to a defect affecting a floating-gate transistor of a memory cell (for example, a drift of its threshold voltage), or to a connection defect of a bit line or of a word line, etc.

To distinguish the word read from the initial secured word X2 that is presumed to be free from any error, the word read in the memory is called X3 and is considered equal to the sum of the word X2 and an error E:

$$X3 = X2 + E$$

The symbol + is the bit to bit addition without carrying the sum forward, and E is a word of $2^K$+J bits representing the error affecting the word X2. This error may possibly be zero.

The word X3 and the error E can also be written as:

$$X3 = DATA(X3) // CODE(X3)$$

$$E = ERR1 // ERR2.$$

DATA(X3) is a word comprising $2^K$ data bits, CODE(X3) is a word comprising J security bits, ERR1 is a word representing the error on the data bits formed by the $2^K$ first bits of the error E, and ERR2 is a word representing the error on the security bits formed by the J following bits of the error E. The result is:

$$DATA(X3) = DATA(X2) + ERR1 = X1 + ERR1$$

$$CODE(X3) = CODE(X2) + ERR2.$$

The symbol + is the bit to bit addition without carrying the sum forward. For a better understanding, and using the example mentioned above ($2^K$=8 and J=4), the words E, ERR1, ERR2, DATA(X3), CODE(X3) are written as mentioned in part 4 of the supplemental information.

The correction of the word X3 incorporating the error E (that can be zero) is carried out by the circuit RD1. This circuit comprises an error correcting block B2, a syndrome or pattern generator block B3, and an error vector generator block B4.

The block B2 has two inputs E1, E2 for receiving $2^K$ bits each, and one output for providing $2^K$ bits. The input E1 receives the data bits of the word X3, i.e., the word DATA(X3). The input E2 receives an error vector EV delivered by the block B4. The block B2 delivers a corrected word X4 that is equal to the initial word X1 provided that the effective error concerns a number of bits lower than or equal to the maximum number of bits that can be detected and corrected.

The word X4 is obtained by the logic combination of the word DATA(X3) and of the vector EV. This logic combination is generally done by the EXCLUSIVE OR function (xor function, symbol $\oplus$).

The block B3 receives the word X3 at an input, applies a function H to the word X3, and delivers a pattern SYN such that:

$$SYN\ 32\ X3*H$$

$$SYN=(X2+E)*H$$

$$SYN=(X1*G+E)*H$$

$$SYN=X1*G*H+E*H$$

$$SYN=E*H$$

The functions H and G are orthogonal functions and their product G*H is equal to 0.

With the Hamming algorithm, the function H is a matrix of $(2^K+K+1)$ lines and $(K+1)$ columns, orthogonal at G. For a better understanding, such a matrix H is described in part 5 of the supplemental information, in which K=3 and J=4. This matrix H generates a pattern SYN of four bits S0, S1, S2, S3 allowing one error per word to be detected and corrected. The logic value of the bits S0 to S4 is described in part 6 of the supplemental information.

The pattern SYN is applied to the block B4 that performs a pattern/vector conversion function EV=f(SYN), and delivers an appropriate vector EV. This pattern/vector conversion function conforms to a predetermined table of correspondence. For a better understanding, a pattern/vector table of correspondence is described in part 7 of the supplemental information, in which K=3 and J=4.

In theory each error vector EV comprises one part EV1 and one part EV2, and can be written $$EV=EV1//EV2$$

EV1 is an error vector of $2^K$ bits representing an error on the data, and EV2 is an error vector of J bits representing an error on the security bits. In practice, error correcting on the security bits is pointless, and only the error vector EV1 is delivered by the block B4 and is applied to the input E2 of the block B2.

The error vector EV is equal to the error E itself when the block B2 performs the EXCLUSIVE OR function. In fact:

$$DATA(X3) \oplus (EV1 = X1$$

However:

$$DATA(X3) \oplus EV1 = X1 + ERR1 \oplus EV1$$

which gives:

$$ERR1 \oplus EV1 = 0$$

which implies that:

$$ERR1 = EV1$$

The symbol + is the bit to bit addition without carrying the sum forward, and $\oplus$ is the EXCLUSIVE OR function.

FIG. 2 represents a device ECC2 that differs from the device ECC1 by the fact that it comprises, in addition, coding and decoding means, which forms a data coding/decoding and security/correction device.

The device ECC2 comprises a data coding and security circuit WR2, and a data decoding and correction circuit RD2. The circuit WR2 has one input IN1 to receive a binary word X0, and one output OUT1 to deliver a secured code word X2. The circuit RD2 has one input IN2 to receive a secured code word X3 having an error E (that can be zero), and one output OUT2 to deliver a corrected decoded word X5.

The circuit WR2 comprises in series one block B0 and the block B1 described above. The input of the block B0 receives at one input the word X0, applies a coding function A to the word X0 and delivers a code word X1 to one input of the block B1. The block B1 applies to the word X1 the function G already described, and delivers the word X2 to the output OUT1 of the circuit WR2. An example of the coding function A is described in part 8 of the supplemental information, in the form of a matrix of $2^K$ lines and $2^K$ columns, in which K=3.

It will now be considered as above that the word X2 is stored in a memory MEM, and the word read subsequently in the memory shall be designated X3, with X3 being equal to the word X2 to which the error E is added. The correction of the error E and the decoding of the word X3 are carried out by the circuit RD2. The latter differs from the circuit RD1 of the device ECC1 by the fact that a decoding block B5 is arranged between the output of the block B2 and the output OUT2. The block B5 applies a decoding function $A^{-1}$ that is the reciprocal of the function A to the data received at its input. An example of the decoding function $A^{-1}$ is described in part 9 of the supplemental information. The function $A^{-1}$ is an inverse matrix of the matrix A described in part 8 of the supplemental information.

The operation of the device ECC2 is therefore as follows. The block B0 generates a code word X1 from the initial word X0. The block B1 generates a secured code word X2 from the code word X1. The block B2 carries out an error correction on a secured code word X3, and delivers a corrected code word X4. The block B5 carries out the decoding of the corrected code word X4 and delivers a corrected decoded word X5. The blocks B1, B3 and B4 are identical to those of the device ECC1, since the word X1 is a code word that has no impact on the security and the correction of this word.

The circuits ECC1 and ECC2 that have just been described are traditionally formed from hard-wired logic blocks. The conversion time of the word X1 into the word X2 (security) and the conversion time of the word X3 into the word X4 (correction) therefore directly varies according to the data propagation time in the logic gates present along the data path between the input IN1 and the output OUT1 and between the input IN2 and the output OUT2.

The drawback of the device ECC2 is that the data transfer process is slowed down by the addition of the blocks B0 and B5 along the data path. The blocks B0 and B5 are in fact, like the blocks B1 to B4, and are produced using logic gates and have a determined data transfer time. The addition of the blocks B0 and B5 can increase by 30 to 50% the data transfer time between the inputs and the outputs of the device ECC2, as compared to the device ECC1.

SUMMARY OF THE INVENTION

In view of the foregoing background, an object of the present invention is to provide a decoding and error correcting method that allows the data processing time to be accelerated.

Another object of the present invention is to provide a decoding and error correcting circuit that has a shorter data transfer time than the prior art circuit described above.

Yet another object of the-present invention is to provide a coding and security circuit that has a shorter data transfer time than the prior art circuit described above.

These and other objects, advantages and features in accordance with the present invention are provided by a decoding and error correcting method applicable to a secured code word likely to have an error relative to an initial secured code word. The method preferably comprises one error correcting step, and one decoding step using a decoding function. The decoding step is carried out before the error correcting step, and preferably comprises application of the decoding function to the secured code word to obtain a secured decoded word containing a coded error.

The error correcting step preferably comprises the application of a coded error vector to the secured decoded word. The method may also comprise one step of determining the coded error vector that is carried out at the same time as the decoding step.

The step of determining the coded error vector may comprise the transformation by the decoding function of a non-coded error vector that would be applicable to the secured code word if the latter were corrected before being decoded.

The step of determining the error vector may comprise one step of determining a pattern by applying a pattern calculation function to the secured code word, and one step of producing the coded error vector directly from the pattern by a table of direct correspondence between the pattern and coded error vector.

The initial secured code word is preferably obtained by transforming, by a coding function, an initial word into a code word, and by transforming the code word using a security function. The initial secured code word is preferably obtained by applying to an initial word a coding and security function that is the result of the combination of a coding function and of a security function. The method is preferably implemented using hard-wired logic circuits.

The present invention also relates to a decoding and error correcting circuit comprising a data path having one input to receive a secured code word and one output to deliver a corrected decoded word. A decoding block is arranged along the data path for applying a decoding function to a word present at one input of the decoding block. An error correcting block is arranged along the data path and has a first input to receive a word to be corrected, and a second input to receive an error vector. The decoding block is arranged on the data path upstream from the error correcting block, and delivers to the first input of the error correcting block a secured decoded word containing a coded error.

The circuit preferably comprises a pattern determination block having one input linked to the input of the data path. The circuit also preferably comprises means for determining a coded error vector, and has one input linked to one output of the pattern determination block and one output linked to the second input of the error correcting block.

The means for determining a coded error vector is arranged to deliver, from a pattern, a coded error vector equal to the transform by the decoding function of a non-coded error vector corresponding to the pattern. The means for determining a coded error vector may comprise a single block performing a conversion conforming to a table of direct correspondence between the pattern and the coded error vector.

The decoding block, the error correcting block, the pattern determination block and the means for determining a coded error vector may be hard-wired logic circuits.

The present invention also relates to a data coding/decoding and security/correction device comprising a decoding and error correcting circuit as defined above for transforming a secured code word into a corrected decoded word, and a coding and security circuit to transform an initial word into the secured code word.

The coding and security circuit preferably comprises means for applying a coding function to an initial word, and for applying a security function to the code word. The coding and security circuit preferably comprises a single coding and security block for applying to an initial word the combination of the coding function and of the security function.

BRIEF DESCRIPTION OF THE DRAWINGS

These and other objects, advantages and features of the present invention shall be explained in greater detail in the following description of the method of the present invention, and an example of an embodiment of a device according to the present invention, given in relation with, but not limited to, the following figures, in which.

DETAILED DESCRIPTION OF THE PREFERRED EMBODIMENTS

Figure 1:
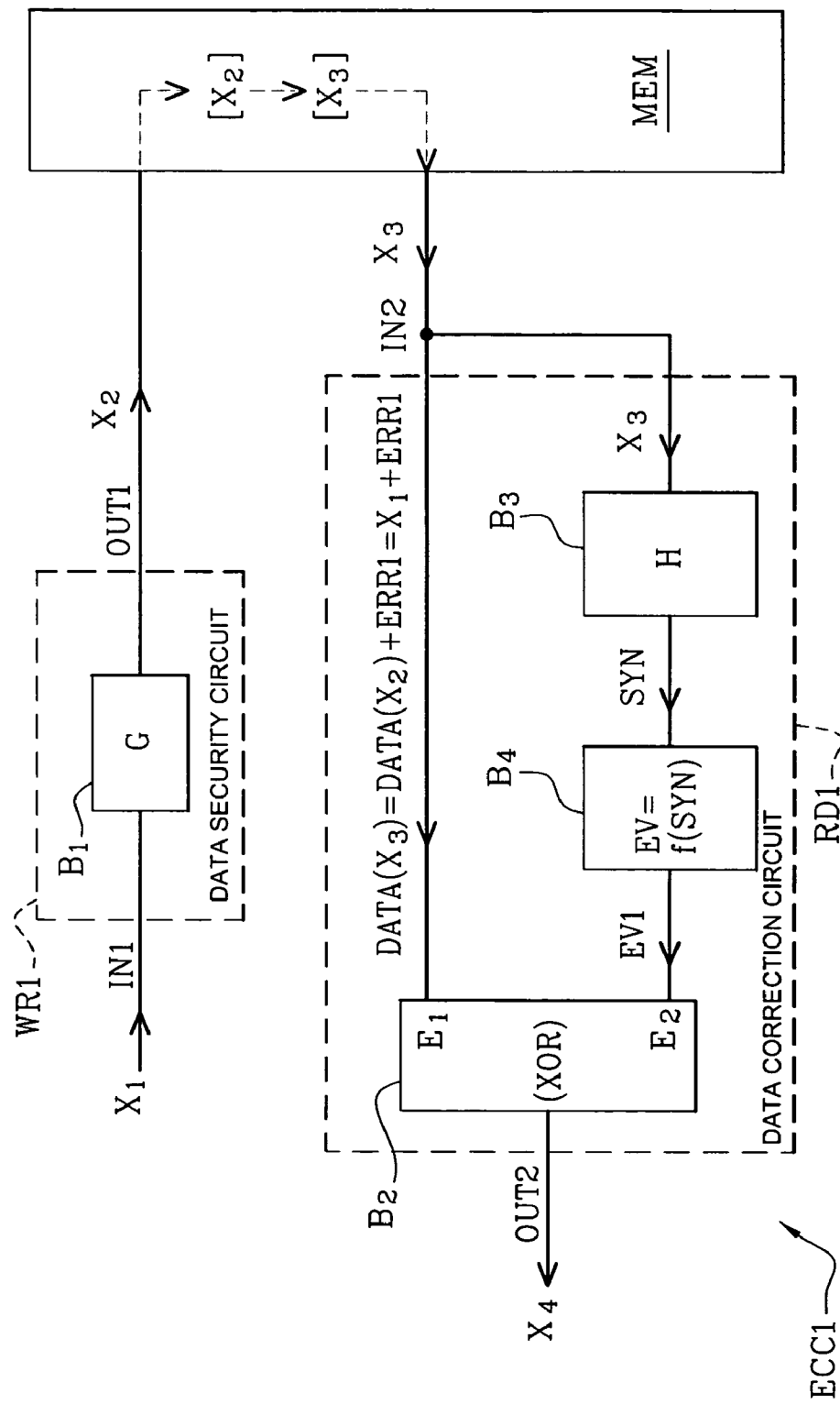
FIG. 1 is a block diagram of a data security and correction device in accordance with the prior art.
Figure 2:
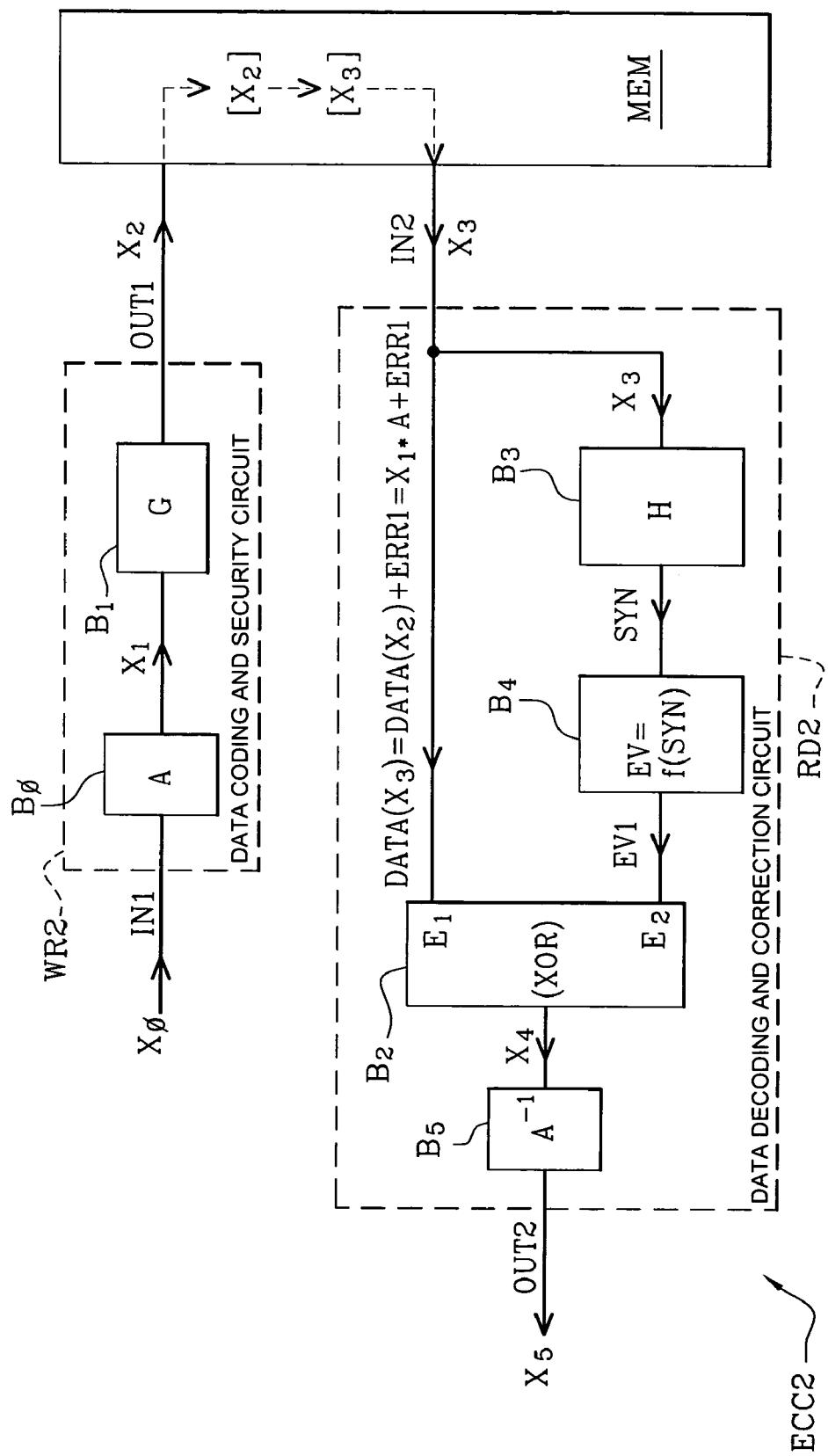
FIG. 2 is a block diagram of a data coding/decoding and security/correction device comprising a coding and security circuit and a decoding and correction circuit in accordance with the prior art.
Figure 3:
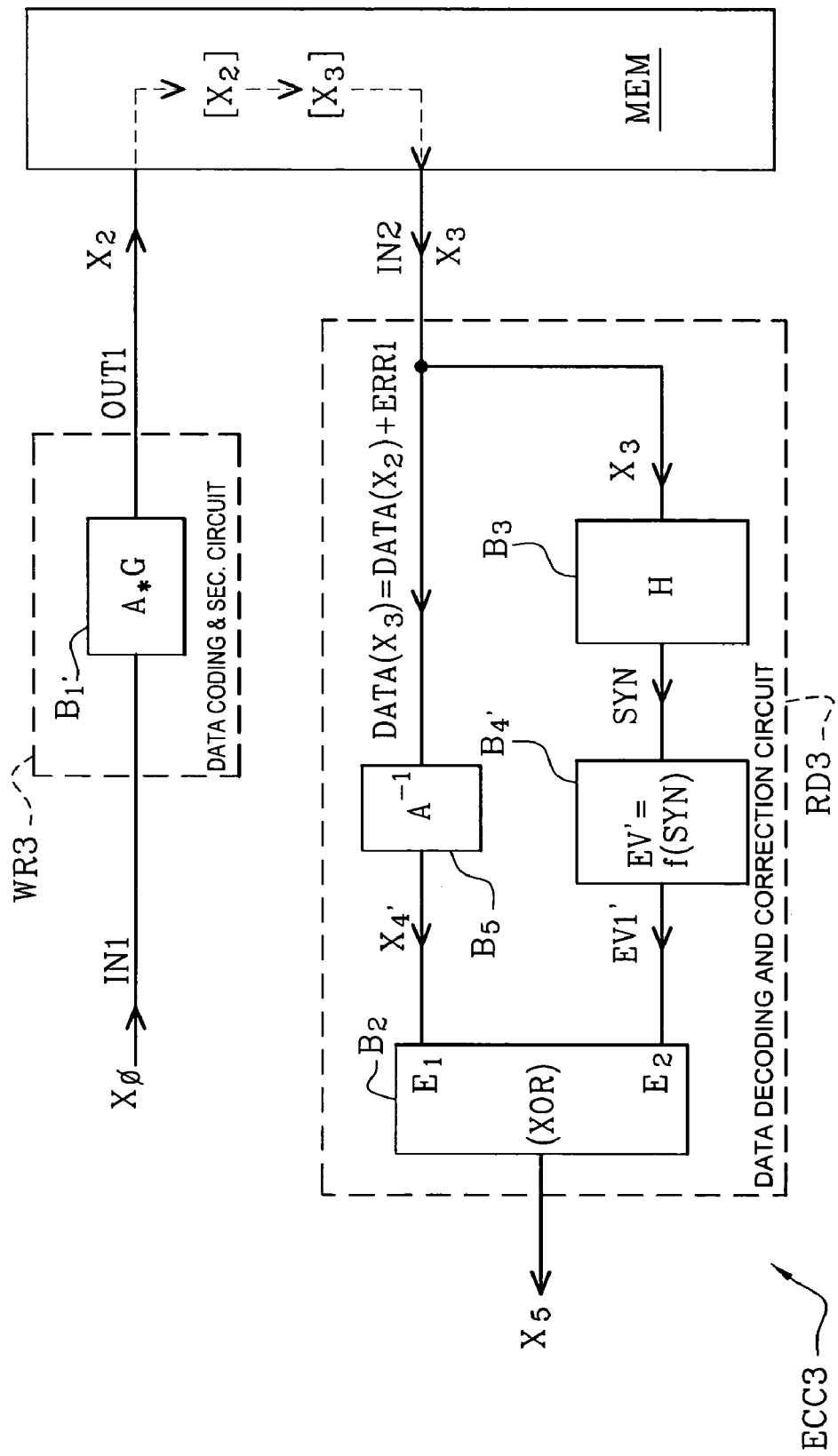
FIG. 3 is a block diagram of a data coding/decoding and security/correction device comprising a coding and security circuit and a decoding and correction circuit in accordance with the present invention.

FIG. 3 represents a data coding/decoding and security/correction device ECC3 according to the present invention. The device ECC3 comprises a data coding and security circuit WR3 and a data decoding and correction circuit RD3. The circuit WR3 has one input IN1 to receive a binary word X0, and one output OUT1 to deliver a secured code word X2. The circuit RD3 has one input IN2 to receive a secured code word X3 having an error E (that can be zero), and one output OUT2 to deliver a corrected decoded word X5.

According to the present invention, the circuit WR3 comprises a block B1' that applies a coding and security function A*G to the word X0, and delivers the secured code word X2 to the output OUT1. The function A*G is the product of a coding function A and of a security function G as readily known by one skilled in the art.

As an example, it will be assumed that only one bit is to be detected and corrected in a word of eight bits by means of the Hamming algorithm. The parameters K and J already described above are, in this case, equal to 3 and to 4. The function G, in this case, is the matrix of 8 lines and 12 columns described in part 2 of the supplemental information. The function A is, for example, the matrix of 8 lines and 8 columns described in part 8 of the supplemental information. The corresponding function A*G according to the present invention, in this case, is equal to the matrix product of A and G and is described in part 10 of the supplemental information.

Generally speaking, the transit time of the data in the block B1' is roughly equal to the transit time of data in one of the prior art blocks B0 or B1 described above. The conversion time of the word X0 into the secured code word X2 is, therefore, noticeably reduced by half in accordance with the present invention.

It will now be considered, as above, that the word X2 is stored in a memory MEM, and the word read subsequently in the memory shall be designated X3. X3 is equal to the sum of the word X2 and an error E. The correction of the error E and the decoding of the word X3 are carried out by the circuit RD3.

The circuit RD3 comprises an error correcting block B2, a pattern generator block B3, an error vector EV' generator block B4', and a decoding block B5. The blocks B2, B3, B5 are identical to the blocks in the prior art circuit ECC2 described above. The block B4' delivers error vectors EV1' having $2^K$ bits corresponding to an error on the data and forming the useful part of an error vector EV' of the type:

$$EV'=EV1'//EV2'$$

in which EV2' is an error vector of J bits corresponding to an error on security codes. EV2' is not used in practice.

According to the present invention, the decoding block B5 that applies the decoding function $A^{-1}$ to the data it receives at input, is arranged on the data path between the input IN2 of the circuit RD3 and the input E1 of the correction block B2. In other terms, the block B2 receives at its input E1 non-corrected decoded data. As illustrated above, the word X3 applied to the input IN2 of the circuit RD3 can be written:

$$X3=X2+E$$

$$X3=X0*A*G+E$$

The symbol + is the bit to bit addition without carrying the sum forward, and E is a word of $2^K+J$ bits representing the error affecting the word X2.

The word X3 and the error E can be written in the following form:

$$X3=DATA(X3)//CODE(X3)$$

$$E=ERR1//ERR2.$$

DATA(X3) is a word comprising the $2^K$ data bits of the word X3, CODE(X3) is a word formed by the J security bits of the word X3, ERR1 is a word comprising the $2^K$ first bits of the error E, and ERR2 is a word comprising the J following bits of the error. The result is:

$$DATA(X3)=DATA(X2)+ERR1=(DATA(X0)*A*G)+ERR1$$

$$CODE(X3)=CODE(X2)+ERR2.$$

The word DATA(X3) is applied to the input of the block B5 without the security bits CODE(X3). Therefore, the word X4' delivered by the block B5 is equal to:

$$X4'=DATA(X3)*A^{-1}=(X0*A*G*A^{-1})+ERR1*A^{-1}$$

As A and $A^{-1}$ are reciprocal functions, the result is:

$$X4'=(X0*G)+ERR1*A^{-1}$$

Since the security function G does not change the data bits, the result is:

$$X4'=X0+ERR1*A^{-1}.$$

Therefore, the word applied X4' to the input of the correction circuit B2 is not a secured code word as in previous practices, but a decoded word comprising a coded error. The decoded word is the word X0 and the coded error is the term $ERR1*A^{-1}$, i.e., the transform of the error ERR1 by the decoding function $A^{-1}$. The decoding function $A^{-1}$ is comparable to a coding function when it is applied to an element that has not previously been coded by the reciprocal function A.

The error vector EV1' that must be applied to the input E2 of the block B2 to correct the coded error $ERR1*A^{-1}$ should now be determined. As the word X3 is applied entirely to the pattern generator block H, the result is:

$$SYN=X3*H$$

$$SYN=(X2+E)*H$$

$$SYN=(X1*A*G+E)*H$$

$$SYN=X1*A*G*H+E*H.$$

Since the product of the functions H and G is zero, the pattern SYN is therefore equal to:

$$SYN=E*H$$

Consequently, the pattern generated by the block B3 is identical to the pattern generated by the block B3 of the devices ECC1 and ECC2 described above.

Moreover, the error vector EV1 is equal to the non-coded error ERR1, such that the error vector EV1' can be expressed from the error vector EV1:

$$EV1'=ERR1*A^{-1}=EV1*A^{-1}.$$

The error vector EV1' according to the present invention is therefore a coded error vector, equal to the transform by the function $A^{-1}$ of the classical error vector EV1.

The block B4' can be produced by combining in series the block B4 and a block performing the function $A^{-1}$. Advantageously, a table of direct correspondence is determined giving the vector EV1' for each pattern value according to the present invention. Each vector EV1' of the table of direct correspondence is calculated by applying the function $A^{-1}$ to the vectors EV1 given by a classical table of correspondence. A hard-wired logic block B4' is then produced performing the conversion function given by the table of direct correspondence.

For a better understanding, a table of correspondence according to the present invention is described in part 11 of the supplemental information. This table of correspondence (Table 2) is obtained by applying the function $A^{-1}$ to the vectors EV of the table of correspondence (Table 1) described in part 7 of the supplemental information.

The operation of the device ECC3 can therefore be summarized as follows. The block B1' generates a secured code word X2 from the initial word X0. The block B5 carries out the decoding of the secured code word X3 and delivers a non-corrected decoded word X4' comprising a coded error $ERR1*A^{-1}$. The block B2 carries out the correction of the coded error by a coded error vector EV1' in the same way as the coded error, i.e., by applying the function $A^{-1}$ to a classical error vector EV1. Preferably, the block B4' delivers directly from the pattern SYN the error vector EV1'.

The decoding and correction circuit RD3 according to the present invention offers the advantage of having a parallel architecture, in which the decoding of the word X3 by the block B5 is carried out at the same time as the determination of the pattern and of the error vector EV1' by the blocks B3 and B4'. Therefore, the decoding operation does not involve any slowing down of the data transfer time as in the prior art circuit ECC2, in which the decoding block B5 is arranged downstream from the correction block.

For a better understanding a description will now be given of an example of implementation of the decoding and correction method according to the present invention, using the functions A, G and H described in the supplemental information. It will be assumed that the word X1 indicated below is to be written then read in the memory MEM:

X1=1 1 0 0 1 0 1 1.

After coding and securing the word X0 using the function A*G (block B1') the following is obtained:

X2=0 1 0 0 0 0 1 1 0 1 0 1.

X3 is written in the memory MEM, and then a word is reread:

X3=X2+E.

Assuming that the error E is as follows:

E=0 0 0 1 0 0 0 0 0 0 0 0.

The read word X3 is therefore equal to:

$$X2 = 0\ 1\ 0\ 0\ 0\ 0\ 1\ 1\ 0\ 1\ 0\ 1$$

$$+E = 0\ 0\ 0\ \underline{1}\ 0\ 0\ 0\ 0\ 0\ 0\ 0\ 0$$

$$= X3 = 0\ 1\ 0\ \underline{1}\ 0\ 0\ 1\ 1\ 0\ 1\ 0\ 1.$$

Using the function H (block B3) the corresponding pattern SYN is calculated:

X3*H=0 1 1 0.

Using the Table 2 in part 11 of the supplemental information (block B4') the coded error vector EV1' is determined:

EV1'=1 0 0 1 1 1 0 1.

At the same time as the determination of the pattern and of the error vector, the non-corrected decoded word X4' is determined by the function $A^{-1}$ (block 5):

X4'=(DATA(X2)+ERR1)*$A^{-1}$=0 1 0 1 0 1 1 0.

Then the word is corrected:

X5=X4' xor EV1'

X5=0 1 0 1 0 1 1 0 xor 1 0 0 1 1 1 0 1

X5=1 1 0 0 1 0 1 1

X5=X1.

It will be clear to those skilled in the art that the data coding/decoding and security/correction device according to the present invention is susceptible to different embodiments and applications. In particular, the applications concern integrated circuits fitted with a memory. The device according to the present invention is interposed between the inputs and outputs of the memory. In particular, these are integrated circuits for smart cards, microcontrollers, integrated memories such as EPROM, EEPROM, FLASH EEPROM type memories, etc.

As another example of application, the coding and security circuit WR3 can be arranged at one end of a data transmission line and the decoding and correction circuit RD3 can be arranged at the other end of the line. This is done to decode and correct the data received, as errors can be due to transmission problems or to disturbances along the line.

SUPPLEMENTAL INFORMATION

Part 1—Words X1 and X2:

X1=x0 x1 x2 x3 x4 x5 x6 x7

X2=DATA(X2)//CODE(X2)

X2=x0 x1 x2 x3 x4 x5 x6 x7 p0 p1 p2 p3 with

DATA(X2)=X1=x0 x1 x2 x3 x4 x5 x6 x7

CODE(X2)=p0 p1 p2 p3 p0, p1, p3, P4 are security bits.

Part 2—Matrix generating security bits according to the Hamming algorithm when K=3 and J=4 (correction of only one error bit):

$$G = \begin{pmatrix} 1 & 0 & 0 & 0 & 0 & 0 & 0 & 0 & 1 & 0 & 0 & 1 \\ 0 & 1 & 0 & 0 & 0 & 0 & 0 & 0 & 1 & 1 & 1 & 0 \\ 0 & 0 & 1 & 0 & 0 & 0 & 0 & 0 & 1 & 1 & 0 & 1 \\ 0 & 0 & 0 & 1 & 0 & 0 & 0 & 0 & 0 & 1 & 1 & 1 \\ 0 & 0 & 0 & 0 & 1 & 0 & 0 & 0 & 0 & 1 & 1 & 0 \\ 0 & 0 & 0 & 0 & 0 & 1 & 0 & 0 & 1 & 0 & 1 & 0 \\ 0 & 0 & 0 & 0 & 0 & 0 & 1 & 0 & 0 & 0 & 1 & 1 \\ 0 & 0 & 0 & 0 & 0 & 0 & 0 & 1 & 0 & 1 & 0 & 1 \end{pmatrix}$$

Part 3—Security bits generated by the matrix G:

p0=x0 xor x1 xor x2 xor x5 p1=x2 xor x3 xor x4 xor x7 xor x1 p2=x4 xor x5 xor x6 xor x1 xor x3 p3=x6 xor x7 xor x0 xor x2 xor x3 xor is the EXCLUSIVE OR function.

Part 4—Words E, ERR1, ERR2, X3, DATA(X3), CODE (X3):

E=ER1//ER2=e0 e1 e2 e3 e4 e5 e6 e7 e8 e9 e10 e11

ERR1=e0 e1 e2 e3 e4 e5 e6 e7

ERR2=e8 e9 e10 e11

X3=X2+E=(x0+e0) (x1+e1) (x2+e2) (x3+e3)

(x4+e4) (x5+e5) (x6+e6) (x7+e7) (p0+e8)

(p1+e9) (p2+e10) (p3+e11)

DATA(X3)=(x0+e0) (x1+e1) (x2+e2) (x3+e3)

(x4+e4) (x5+e5) (x6+e6) (x7+e7)

CODE(X3)=(p0+e8) (p1+e9) (p2+e10) (p3+e11)

Part 5—Hamming matrix H when K=3 and J=4:

$$H = \begin{pmatrix} 1 & 0 & 0 & 1 \\ 1 & 1 & 1 & 0 \\ 1 & 1 & 0 & 1 \\ 0 & 1 & 1 & 1 \\ 0 & 1 & 1 & 0 \\ 1 & 0 & 1 & 0 \\ 0 & 0 & 1 & 1 \\ 0 & 1 & 0 & 1 \\ 1 & 0 & 0 & 0 \\ 0 & 1 & 0 & 0 \\ 0 & 0 & 1 & 0 \\ 0 & 0 & 0 & 1 \end{pmatrix}$$

Part 6—Value of the pattern SYN generated by the matrix H when K=3 and J=4:

SYN=S0 S1 S2 S3

S0=x0 xor x1 xor x2 xor x5 xor p0

S1=x2 xor x3 xor x4 xor x7 xor x1 xor p1

S2=x4 xor x5 xor x6 xor x3 xor x1 xor p2

S3=x6 xor x7 xor x3 xor x2 xor x0 xor p3

Part 7—Example of a classical table of correspondence when K=3 and J=4:

TABLE 1

| | Vector EV | |
|---|---|---|
| PATTERN | EV1 | EV2 |
| 0 1 0 1 | 1 0 0 0 0 0 0 0 | 0 0 0 0 |
| 0 0 1 1 | 0 1 0 0 0 0 0 0 | 0 0 0 0 |
| 1 0 1 0 | 0 0 1 0 0 0 0 0 | 0 0 0 0 |
| 0 1 1 0 | 0 0 0 1 0 0 0 0 | 0 0 0 0 |
| 0 1 1 1 | 0 0 0 0 1 0 0 0 | 0 0 0 0 |
| 1 1 0 1 | 0 0 0 0 0 1 0 0 | 0 0 0 0 |
| 1 1 1 0 | 0 0 0 0 0 0 1 0 | 0 0 0 0 |
| 1 0 0 1 | 0 0 0 0 0 0 0 1 | 0 0 0 0 |
| 0 0 0 0 | 0 0 0 0 0 0 0 0 | 0 0 0 1 |
| 0 0 0 1 | 0 0 0 0 0 0 0 0 | 0 0 1 0 |
| 0 0 1 0 | 0 0 0 0 0 0 0 0 | 0 1 0 0 |
| 0 1 0 0 | 0 0 0 0 0 0 0 0 | 1 0 0 0 |
| 1 0 0 0 | 0 0 0 0 0 0 0 0 | 0 0 0 0 |
| 1 0 1 1 | 0 0 0 0 0 0 0 0 | 0 0 0 0 |
| 1 1 0 0 | 0 0 0 0 0 0 0 0 | 0 0 0 0 |
| 1 1 1 1 | 0 0 0 0 0 0 0 0 | 0 0 0 0 |

Part 8—Example of coding function A when K=3:

$$A = \begin{pmatrix} 1 & 1 & 0 & 0 & 0 & 1 & 0 & 1 \\ 0 & 1 & 0 & 0 & 0 & 0 & 0 & 0 \\ 0 & 1 & 1 & 0 & 1 & 0 & 0 & 0 \\ 1 & 0 & 0 & 1 & 0 & 0 & 0 & 1 \\ 0 & 0 & 0 & 0 & 1 & 0 & 0 & 0 \\ 0 & 1 & 0 & 0 & 0 & 1 & 0 & 1 \\ 1 & 1 & 0 & 0 & 0 & 1 & 1 & 1 \\ 0 & 0 & 0 & 0 & 1 & 0 & 0 & 1 \end{pmatrix}$$

Part 9—Example of decoding function $A^{-1}$ when K=3:

$$A^{-1} = \begin{pmatrix} 1 & 0 & 0 & 0 & 0 & 1 & 0 & 0 \\ 0 & 1 & 0 & 0 & 0 & 0 & 0 & 0 \\ 0 & 1 & 1 & 0 & 1 & 0 & 0 & 1 \\ 1 & 0 & 0 & 1 & 1 & 1 & 0 & 1 \\ 0 & 0 & 0 & 0 & 1 & 0 & 0 & 0 \\ 0 & 1 & 0 & 0 & 1 & 1 & 0 & 1 \\ 1 & 0 & 0 & 0 & 0 & 0 & 1 & 0 \\ 0 & 0 & 0 & 0 & 1 & 0 & 0 & 1 \end{pmatrix}$$

Part 10—Example of coding and security function A*G when K=3:

$$A*G = \begin{pmatrix} 1 & 1 & 0 & 0 & 0 & 1 & 0 & 1 & 0 & 1 & 0 & 1 \\ 0 & 1 & 0 & 0 & 0 & 0 & 0 & 0 & 1 & 1 & 1 & 0 \\ 0 & 1 & 1 & 0 & 1 & 0 & 0 & 0 & 0 & 1 & 0 & 1 \\ 1 & 0 & 0 & 1 & 0 & 0 & 0 & 1 & 1 & 0 & 1 & 1 \\ 0 & 0 & 0 & 0 & 1 & 0 & 0 & 0 & 0 & 1 & 1 & 0 \\ 0 & 1 & 0 & 0 & 0 & 1 & 0 & 1 & 0 & 0 & 0 & 1 \\ 1 & 1 & 0 & 0 & 0 & 1 & 1 & 1 & 0 & 1 & 1 & 1 \\ 0 & 0 & 0 & 0 & 1 & 0 & 0 & 1 & 0 & 0 & 1 & 1 \end{pmatrix}$$

Part 11—Example of a table of correspondence according to the present invention when K=3 and J=4:

TABLE 2

| | Vector EV' = EV * $A^{-1}$ | |
|---|---|---|
| PATTERN | EV1' = EV1 * $A^{-1}$ | EV2' = EV2 * $A^{-1}$ |
| 0 1 0 1 | 1 0 0 0 0 1 0 0 | (not used) |
| 0 0 1 1 | 0 1 0 0 0 0 0 0 | (not used) |
| 1 0 1 0 | 0 1 1 0 1 0 0 1 | (not used) |
| 0 1 1 0 | 1 0 0 1 1 1 0 1 | (not used) |
| 0 1 1 1 | 0 0 0 0 1 0 0 0 | (not used) |
| 1 1 0 1 | 0 1 0 0 1 1 0 1 | (not used) |
| 1 1 1 0 | 1 0 0 0 0 0 1 0 | (not used) |
| 1 0 0 1 | 0 0 0 0 1 0 0 1 | (not used) |
| 0 0 0 0 | 0 0 0 0 0 0 0 0 | (not used) |
| 0 0 0 1 | 0 0 0 0 0 0 0 0 | (not used) |
| 0 0 1 0 | 0 0 0 0 0 0 0 0 | (not used) |
| 0 1 0 0 | 0 0 0 0 0 0 0 0 | (not used) |
| 1 0 0 0 | 0 0 0 0 0 0 0 0 | (not used) |
| 1 0 1 1 | 0 0 0 0 0 0 0 0 | (not used) |
| 1 1 0 0 | 0 0 0 0 0 0 0 0 | (not used) |
| 1 1 1 1 | 0 0 0 0 0 0 0 0 | (not used) |

That which is claimed is:

1. A decoding and error correcting method applicable to a secured code word having an error relative to an initial secured code word, the method comprising:
    decoding the secured code word by applying a decoding function thereto to obtain a secured decoded word containing a coded error; and
    performing error correction on the secured decoded word containing the coded error.

2. A method according to claim 1, wherein performing the error correction comprises applying a coded error vector to the secured decoded word.

3. A method according to claim 2, further comprising determining the coded error vector at a same time as the decoding is performed.

4. A method according to claim 3, wherein determining the coded error vector comprises using the decoding function for transforming a noncoded error vector applicable to the secured code word if the secured code word was corrected before being decoded.

5. A method according to claim 3, wherein determining the coded error vector comprises determining a pattern by applying a pattern calculation function to the secured code word, with the coded error vector being produced directly from the pattern based upon a table of direct correspondence between the pattern and the coded error vector.

6. A method according to claims 1, wherein the initial secured code word is obtained using a coding function for transforming an initial word into a code word, then using a security function for transforming the code word to the initial secured code word.

7. A method according to claim 1, wherein the initial secured code word is obtained by applying to an initial word a coding and security function that is a result of a combination of a coding function and a security function.

8. A method according to claim 1, wherein the decoding and error correction are performed using logic circuits.

9. A decoding and error correcting circuit comprising:
a data path having an input for receiving a secured code word and an output for delivering a corrected decoded word;
a decoding circuit arranged along said data path for applying a decoding function to the secured code word for providing a secured decoded word containing a coded error; and
an error correcting circuit arranged along said data path downstream of said decoding circuit and having a first input for receiving the secured decoded word containing the coded error, a second input for receiving an error vector, and an output linked to the output of said data path for providing the corrected decoded word.

10. A decoding and error correcting circuit according to claim 9, further comprising:
a pattern determination circuit having an input linked to the input of said data path; and
error vector generator means for determining a coded error vector, and having an input linked to an output of said pattern determination circuit and an output linked to the second input of said error correcting circuit.

11. A decoding and error correcting circuit according to claim 10, wherein said error vector generator means delivers, from a pattern, the coded error vector being equal to a transform of a non-coded error vector corresponding to the pattern by the decoding function.

12. A decoding and error correcting circuit according to claim 11, wherein said error vector generator means performs a conversion based upon a table of direct correspondence between the pattern and the coded error vector.

13. A decoding and error correcting circuit according to claim 10, wherein said decoding circuit, said error correcting circuit, said pattern determination circuit and said error vector generator means are logic circuits.

14. A decoding and error correcting circuit comprising:
a decoding circuit having an input for receiving a secured code word, said decoding circuit for applying a decoding function to the secured code word for providing a secured decoded word containing a coded error; and
an error correcting circuit connected downstream of said decoding circuit and having a first input for receiving the secured decoded word containing the coded error, a second input for receiving an error vector, and an output for providing a corrected decoded word.

15. A decoding and error correcting circuit according to claim 14, further comprising:
a pattern determination circuit having an input for receiving the secured code word; and
an error vector generator circuit for determining a coded error vector, and having an input linked to an output of said pattern determination circuit and an output linked to the second input of said error correcting circuit.

16. A decoding and error correcting circuit according to claim 15, wherein said error vector generator circuit delivers, from a pattern, the coded error vector being equal to a transform of a non-coded error vector corresponding to the pattern by the decoding function.

17. A decoding and error correcting circuit according to claim 16, wherein said error vector generator circuit performs a conversion based upon a table of direct correspondence between the pattern and the coded error vector.

18. A decoding and error correcting circuit according to claim 15, wherein said decoding circuit, said error correcting circuit, said pattern determination circuit and said error vector generator circuit are logic circuits.

19. A data coding/decoding and security/correction device comprising:
a coding and security circuit for transforming an initial word into a secured code word; and
a decoding and error correcting circuit connected to said coding and security circuit for transforming the secured code word into a corrected decoded word, said decoding and error correcting circuit comprising
a data path having an input for receiving the secured code word and an output for delivering the corrected decoded word,
a decoding circuit arranged along said data path for applying a decoding function to the secured code word for providing a secured decoded word containing a coded error, and
an error correcting circuit arranged along said data path downstream of said decoding circuit, and having a first input for receiving the secured decoded word to be corrected, and a second input for receiving a coded error vector, and an output connected to the output of said data path for delivering the corrected decoded word.

20. A data coding/decoding and security/correction device according to claim 19, wherein said coding and security circuit applies a coding function to the initial word to obtain a code word, and applies a security function to the code word to obtain the secured code word.

21. A data coding/decoding and security/correction device according to claim 19, wherein said coding and security circuit applies to the initial word a combination of a coding function and a security function.

22. A data coding/decoding and security/correction device according to claim 19, wherein said decoding and error correcting circuit further comprises:
a pattern determination circuit having an input linked to the input of said data path; and
an error vector generator circuit for determining the coded error vector, and having an input linked to an output of said pattern determination circuit and an output linked to the second input of said error correcting circuit.

23. A data coding/decoding and security/correction device according to claim 22, wherein said error vector generator circuit delivers, from a pattern, the coded error vector being equal to a transform of a non-coded error vector corresponding to the pattern by the decoding function.

24. A data coding/decoding and security/correction device according to claim 22, wherein said error vector generator circuit performs a conversion based upon a table of direct correspondence between the pattern and the coded error vector.

25. A data coding/decoding and security/correction device according to claim 19, wherein said decoding circuit, said error correcting circuit, said pattern determination circuit and said error vector generator circuit comprise logic circuits.

* * * * *